United States Patent
Platzgummer et al.

(10) Patent No.: US 6,909,103 B2
(45) Date of Patent: Jun. 21, 2005

(54) ION IRRADIATION OF A TARGET AT VERY HIGH AND VERY LOW KINETIC ION ENERGIES

(75) Inventors: Elmar Platzgummer, Vienna (AT); Gerhard Stengl, Wernberg (AT); Hans Loeschner, Vienna (AT)

(73) Assignee: IMS-Ionen Mikrofabrikations Systeme GmbH, Vienna (AT)

(*) Notice: Subject to any disclaimer, the term of this patent is extended or adjusted under 35 U.S.C. 154(b) by 0 days.

(21) Appl. No.: 10/886,463

(22) Filed: Jul. 7, 2004

(65) Prior Publication Data

US 2005/0012052 A1 Jan. 20, 2005

(30) Foreign Application Priority Data

Jul. 18, 2003 (AT) .................................... A 1131/2003

(51) Int. Cl.[7] ...................... H01J 37/317; H01J 37/145
(52) U.S. Cl. ........................... 250/492.21; 250/492.22; 250/492.23; 250/492.2; 250/492.1; 250/492.3; 250/396 R; 250/396 ML; 250/398; 430/30
(58) Field of Search ...................... 250/492.21, 492.22, 250/492.23, 492.1, 492.2, 492.3, 396 R, 398, 396 ML; 430/30

(56) References Cited

U.S. PATENT DOCUMENTS

| | | | | |
|---|---|---|---|---|
| 3,983,401 A | * | 9/1976 | Livesay | 250/492.2 |
| 4,985,634 A | | 1/1991 | Stengl et al. | |
| 5,742,062 A | | 4/1998 | Stengl et al. | |
| 6,429,441 B1 | * | 8/2002 | Nakasuji | 250/492.2 |
| 2005/0012052 A1 | * | 1/2005 | Platzgummer et al. | 250/492.21 |

OTHER PUBLICATIONS

Gillaspy, J.D., Parks, D.C., Ratliff, L.P.; "Masked Ion Beam Lithography with Highly Charged Ions"; J. Vac. Sci. Technol. B16(6); Nov./Dec. 1998, American Vacuum Society; pp. 3294–3297.

Werner, T., Zschornack, G., Grossmann, F., Ovsyannikov, V.P., Ullmann, F.; "The Dresden EBIT: An Ion Source for Materials Research and Technological Applications of Low Energy Highly Charged Ions"; Nuclear Instruments and Methods in Physics Research B 178 (2001), Elsevier Science B.V.; pp. 260–264.

* cited by examiner

Primary Examiner—John R. Lee
Assistant Examiner—Bernard E. Souw
(74) Attorney, Agent, or Firm—Joseph E. Maenner; Monte & McGraw, P.C.

(57) ABSTRACT

A particle-beam exposure apparatus (1) for irradiating a target (41) by means of a beam (2) of energetic electrically charged particles comprises: an illumination system (101) for generating and forming said particles into a directed beam (21); a pattern definition means (102) located after the illumination system for positioning a pattern of apertures transparent to the particles in the path of the directed beam, thus forming a patterned beam (22) emerging from the pattern definition means through the apertures; and a projection system (103) positioned after the pattern definition means (102) for projecting the patterned beam (22) onto a target (41) positioned after the projection system. The apparatus further comprises an acceleration/deceleration means (32) containing an electric potential gradient which is oriented substantially parallel to the path of the structured beam and constant over at least a cross-section of the beam.

11 Claims, 6 Drawing Sheets

ION IRRADIATION OF A TARGET AT VERY HIGH AND VERY LOW KINETIC ION ENERGIES

CROSS-REFERENCE TO RELATED APPLICATION

This application claims the benefit of Austrian Patent Application Ser. No. A 1131/2003, filed 18 Jul. 2003.

FIELD OF THE INVENTION AND DESCRIPTION OF PRIOR ART

The present invention relates to an apparatus for irradiating a target with ions, in particular for implanting ions into the target. More particularly, the invention relates to a particle-beam exposure apparatus for irradiating a target by means of a beam of energetic electrically charged particles, comprising an illumination system for generating and forming said energetic particles into a directed beam, a pattern definition means located after the illumination system as seen along the direction of the beam, said pattern definition means being adapted to position a pattern composed of apertures transparent to the energetic particles in the path of the directed beam, thus forming a patterned beam emerging from the pattern definition means through the apertures, and a projection system positioned after the pattern definition means and adapted to project the patterned beam onto a target positioned after the projection system.

An apparatus of this kind is, for instance, disclosed in the U.S. Pat. No. 4,985,634 (=EP 0 344 646) of the applicant. There, the apparatus is primarily intended for lithography purposes, where a target such as a resist-covered substrate is exposed to an ion beam in order to develop designated regions of the target (or resist cover). This use exploits the energetic impact of the ion radiation; other uses of ion irradiation are, for instance, implantation of ions into a target layer, doping, irradiation-induced mixing, irradiation-induced phase transitions of metastable materials and so on. Some of these applications require ions having high energies, i.e., in the range of several 100 keV, several MeV or even higher.

J. D. Gillaspy et al., in the article "Masked ion beam lithography with highly charged ions", J. Vac. Sci. Technol. B 16(6) (1998), pp. 3294–3297, demonstrate the production of an array of micrometer wide dots on a resist, using Xe ions with a positive charge of q=+44e. The Xe ions were produced in an electron beam ion trap (EBIT) source; a source of this kind is described in the article of T. Werner et al., "The Dresden EBIT", Nucl. Instr. and Meth. in Phys. Res. B 178 (2001), pp. 260–264. For definition of the pattern, J. D. Gillaspy et al. used a stencil mask with a two-dimensional array of openings; the stencil mask was positioned directly on top of the resist-covered target. Contact masks have various problems, in particular that the pattern to be formed on the target must be present in the mask at the same scale; also, the irradiation of a mask with the high-energy ions would drastically reduce its lifetime.

Non-contact masks, on the other hand, are well known from lithography projection apparatuses. However, ion-optical treatment of ions of these high energies would be difficult in a state-of-the-art ion-beam lithography apparatus since it would require correspondingly higher voltages in the electrostatic lenses used.

On the other hand, also applications at very low energies are attractive, where the kinetic energy of the ions is well below the energy values used so far in connection with lithography apparatus and related systems, and is in the range of 1000 eV down to few eV per charge. Low kinetic energy means that the major interaction of the ion with the substrate is due to the potential energy of the ion, which may be set free when electrons from the substrate are transferred to the ion during ion-surface interaction.

SUMMARY OF THE INVENTION

It is a goal of the present invention to provide a means for irradiating a substrate with ions of a wide span of values of kinetic energy according to a pre-defined pattern with high accuracy.

This goal is reached by means of an apparatus as described in the beginning which further comprises at least one acceleration/deceleration means containing an electric potential gradient oriented substantially parallel to the path of the beam, wherein the electric potential gradient is constant over at least a cross-section of the beam permeating the acceleration/deceleration means.

From the provision of an acceleration/deceleration means, which imparts the final energy to the ions used, after the mask, a number of advantages result. The invention combines established projection optical system technology (such as that disclosed in the U.S. Pat. No. 4,985,634) with acceleration and/or deceleration of the charged particle beam. Thus, the resolution as well as the lifetime of the stencil mask used is optimized even for unusual kinetic ion energies to be used at the target, such as for example very low energies $E < n \cdot 20$ eV (where n is the charge number of the ion or electrically charged particle) as well as high energies $E > 100$ keV.

In the case of high-ion energies, it is advantageous that the projection system can operate at comparatively low ion energies of less than 100 keV per charge, while the energy at the mask would be typically 5 keV per charge. Therefore, for the mask the irradiation stress is kept low, resulting in a high lifetime as required for industrial implementations, and standard technologies for mask production and protection coverings for masks as known from conventional ion-beam lithography can be used. Due to the comparatively low ion energies before the final acceleration, the ion-optical system can be designed for electrostatic voltages and field strengths feasible in ion-beam projection, which allows to keep the overall length of the optical column, and hence the tool foot print and height, small enough to be implemented in production environments.

In order to achieve the various ion energies, it is advantageous when the energetic electrically charged particles are multiply charged. Since the ion energy results from the product of ion charge and electric voltage employed ($E = q \cdot U$), this allows to use accordingly lower electrostatic voltages in order to obtain a desired ion energy. Thus, with highly charged ions, such as $Ar^{+n}$ ($n \geq 9$) or $Xe^{+n}$ ($n \geq 44$), n times higher kinetic energies can be reached. In this context, various electrically charged particles could be used, but preferably heavy ions, $Z \geq 2$, preferably, $Z \geq 18$.

In a preferred version of the invention the acceleration/deceleration means is an electrostatic gradient tube for acceleration/deceleration of the electrically charged particles by an energy difference corresponding to more than 50 kV potential difference, equivalent to an energy difference of $n \cdot 50$ keV where n is the charge number of the particles. More preferably, the energy difference corresponds to more than 100 kV potential difference. In an advantageous implementation of the invention, the electric potential gradient in the acceleration/deceleration means is substantially constant along at least a part, usually the major part, of the length of the acceleration/deceleration means.

The invention uses the fact that for state-of-the-art all-electrostatic electrooptical system, the trajectories of the charged particles are independent of the particular mass and charge state, provided the sign of the particle charge is maintained and the interaction between particle my be neglected, i.e., at low currents. Thus, for instance a 44 times increased kinetic energy can be achieved by using $Xe^{44+}$ (instead of $Xe^+$) without a change in the magnification factor of the imaging. In fact, chromatic as well as stochastic aberrations are improved by using highly charged ions, whereas the geometric aberrations remain the same as for single charged ions. Due to the unavoidable limitation of the focus lengths in a demagnifying projection system by the limitation of electrostatic field strengths occurring between the electrodes and due to vacuum feedthroughs, the use of highly charged ions offers an effective way to extent the projection technique, as for example that described in U.S. Pat. No. 4,985,634, to higher kinetic energies, improving image quality and extending applicability.

Another major advantage of the invention is that with multiply charged ions, the imaging aberrations are reduced. Chromatic aberrations are drastically reduced due to the high kinetic energy imparted to the ions. Moreover, the effect of stochastic blur is reduced, as it is approximately proportional to $m^{0.3}$ and $q^{-1.3}$, where m is the mass of the ion, and q its electrical charge. Thus, for instance by using $Ar^{18+}$ instead of $He^+$ ions, a reduction of the stochastic blur by a factor of 20 is reached.

On the other hand, when a deceleration of the ions is used, the same system allows very low energies at the substrate, and the length of the reduction optics can be reduced dramatically due to the low particle energies, and consequently the space charge related blur such as stochastic interaction is reduced in a corresponding way.

The deceleration means either before or after the mask level reduce the energy in the subsequent projection system, which allows a miniaturized fabrication of the projection system and, as a consequence, to an improved optical performance. Preferably, the acceleration/deceleration means is positioned immediately in front of the mask or pattern definition means, as seen along the direction of the beam.

Thus, for patterning at high kinetic energies, the projection system comprises an acceleration means containing an electric field oriented substantially parallel to the path of the structured beam. The illumination system may additionally comprise a deceleration means, which leads to reduced energy at the mask level avoiding unwanted transmission of the ions through the stencil mask and irradiation damage, the mask consisting for example of a membrane structure with small openings. On the other hand, for low-energy purposes, the illumination system comprises a deceleration means which leads to reduced energy of the particles entering the projection system. The alternative deceleration means after the mask level allows higher energies at the mask level to avoid effects such as deflection by charging up phenomena and scattering by dielectric interaction with the mask when going through the openings (image charge interaction).

BRIEF DESCRIPTION OF THE DRAWINGS

In the following, the present invention is described in more detail with reference to the drawings, which schematically show.

DETAILED DESCRIPTION OF THE INVENTION

Figure 1:
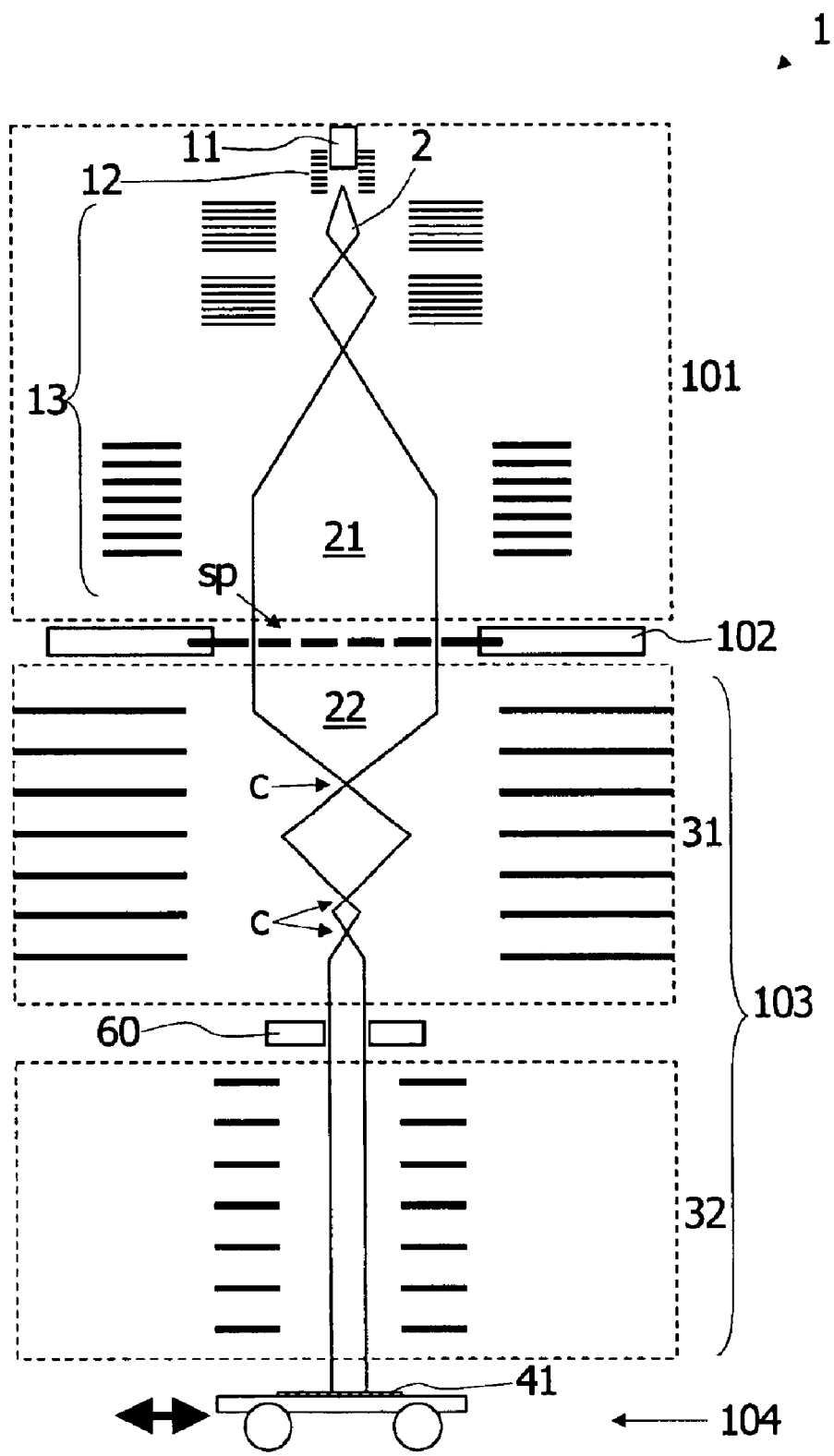
FIG. 1 a longitudinal section of an implantography apparatus according to a first embodiment of the invention.

An overview of an implantography apparatus 1 according to a first preferred embodiment of the invention is shown in the schematic overview of FIG. 1. In the following, only those details are given as needed to disclose the invention; for the sake of clarity, the components are not shown to size in FIG. 1. The main components of the implantography apparatus 1 are—corresponding to the direction of the ion beam 2 which runs vertically downward in FIG. 1—an illumination system 101, a pattern definition system 102, a projecting system 103 comprising a demagnifying projection system 31 and an acceleration system 32, and a target station 104 with the target 41. The whole apparatus 1 is contained in a vacuum housing (not shown) held at high vacuum to ensure an unimpeded propagation of the beam 2 along the optical axis of the apparatus. In the embodiment shown, the particle-optical systems 101,103 are largely realized using electrostatic lenses; it should be noted that other implementations, such as electromagnetic lenses may be used as well.

The illumination system 101 comprises an ion source 11 of highly charged ions fed by a gas supply (not shown) and an extraction system 12, emitting energetic ions, i.e., ions having a well-defined (kinetic) energy. Instead of an ion source, a beam line with a focusing element can be connected as well and used as starting point for the illumination system 101. In typical sources used in conventional ion-beam lithography, the kinetic energy after extraction is several keV, e.g. 5 keV. In the embodiment shown, an EBIT source for Ar ions are used; of course, other heavy species ($Z \geq 18$) may be used as well. It is one advantage of the EBIT source, that the ion species can be switched easily. The ion species are multiply charged ($q \geq +2e$), preferably totally ionized ($q=+Ze$) or almost totally ionized ($q=+[Z-n]e$, $n \leq 12$). By means of an electro-optical condenser lens system 13, the ions emitted from the source 11 are formed into a wide, substantially telecentric ion beam 21 which is directed at the pattern definition means 102. As the ion beam extracted from an EBIT source contains, in general, many different charge states at the same time, which will lead to different ion energies at the substrate, for some applications a particular charge state has to be separated. For this purpose, standard charge separators as for example a Wien filter or double focusing magnetic spectrometers can be used.

At the pattern definition means 102 the beam 21 irradiates a pattern sp which is held at a specific position in the path of the beam. The pattern sp is composed of a plurality of apertures; in the embodiment shown the pattern is realized on a stencil mask as a multitude of apertures or, more generally, regions transparent to the ion radiation (stencil pattern). The beam 2 is thus formed into a patterned beam 22 emerging from the apertures (in FIG. 1, below the device 102).

The pattern as represented by the patterned beam 22 is then projected by means of an electro-optical projection system 103 onto the substrate 41 where it forms an image of the mask apertures 21. The demagnifying component 31 ensures a demagnification by a factor of typically 4 to 200. Preferably, the beam 22 is formed to a telecentric image of the pattern sp at the target 41. The electrostatic lenses used to realize the ion-optical arrangements of the projection system 103 are shown in symbolic form only in FIG. 1 since technical realizations of electrostatic imaging systems are well known in the prior art, such as, for instance, the U.S. Pat. No. 4,985,634 and 5,742,062 of the applicant.

The demagnifying component 31 of the projection system 103 has one or more crossovers c and implements an image reduction of, for instance, 4×. In particular if a reduction higher than 50 is desired, the demagnifying component 31 may also be realized as a multi-stage reducing imaging system with several crossovers c. Thus, high image reductions of, for instance, 200× can be realized. After the demagnifying component 31, an acceleration system is provided which enhances the kinetic energy of the ions on their way towards the target 41. The acceleration system 32 is, for instance, realized as a constant gradient tube realizing a linear acceleration of the ions along the length of the tube.

Furthermore, the apparatus 100 may comprise an alignment system 60 which allows to stabilize the position of the image of the mask apertures on the target with respect to the ion-optical system. This is, for instance achieved by means of reference beams which are formed in the pattern definition system by reference marks also irradiated by the beam 21, but which are registered in the alignment system 60 (rather than impinging on the target 41); the principles of an alignment system and its preferable components are described in the U.S. Pat. No. 4,967,088. The alignment system can furthermore ensure compensation for image placement errors which are due to deviations in the stage movement, using a real-time feedback controller in conjunction with a multipole pattern correction.

In known ion-beam systems, the alignment system is positioned right in front of the target. In conjunction with the invention, when a deceleration/acceleration tube is present in front of the target, to generate the effect of a "diverging lens" due to the electrostatic field between the exit electrode of the tube and the substrate it is usually more preferable to position the alignment system in front of the tube as shown in FIG. 1.

Figure 2:
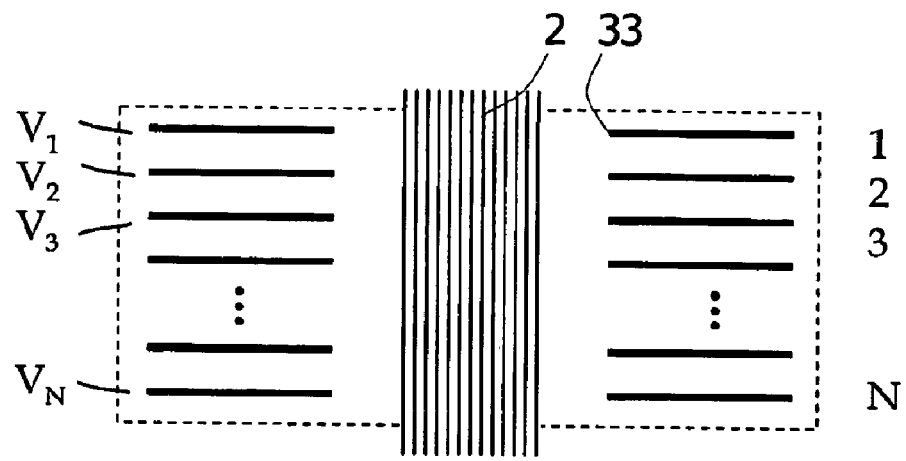
FIG. 2 a layout of an acceleration tube as used in the apparatus of FIG. 1.
Figure 3:
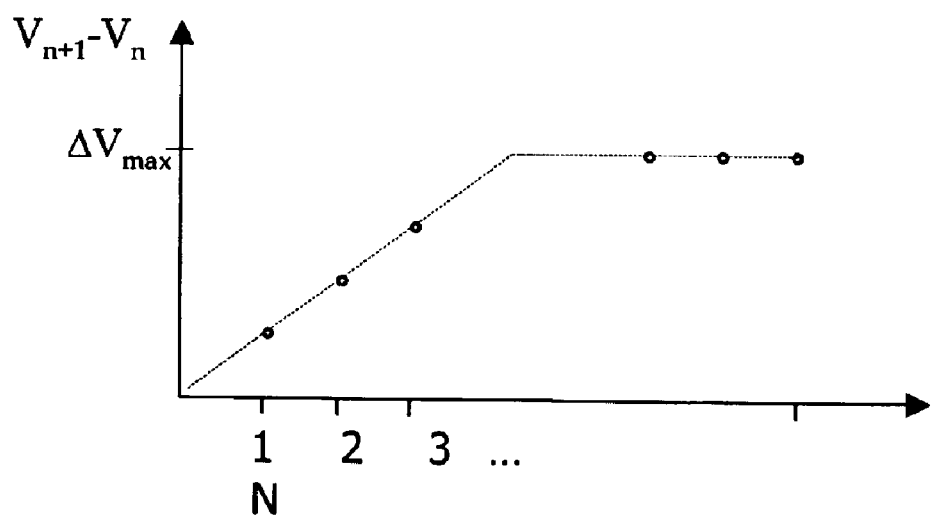
FIG. 3 the voltage increments in the acceleration tube of FIG. 2.

FIG. 2 shows the principle of the acceleration means as used in the apparatus 1. A sequence of ring-shaped electrodes 33 are displaced at equal distances along the optical axis in a coaxial fashion. Different electrostatic voltages $V_1$, $V_2$, $V_3$, ... $V_N$ are applied to the N electrodes. The width of the openings in the electrodes is sufficient so as to ensure that the electric field established by the sequence of voltages is homogeneous for the area that the ion beam 2 permeates. In order to reduce focusing or defocusing at the entry of the accelerator (decelerator) tube, the field strength (as seen by the ions) is increased moderately at the beginning of the tube. Therefore, the difference of the voltages between consecutive electrodes (FIG. 3) is constant, with exception for the first few electrodes where the voltage difference increases, e.g. linearly, from zero to the final level $\Delta V_{max}$ within the body of the acceleration tube.

Figure 4:
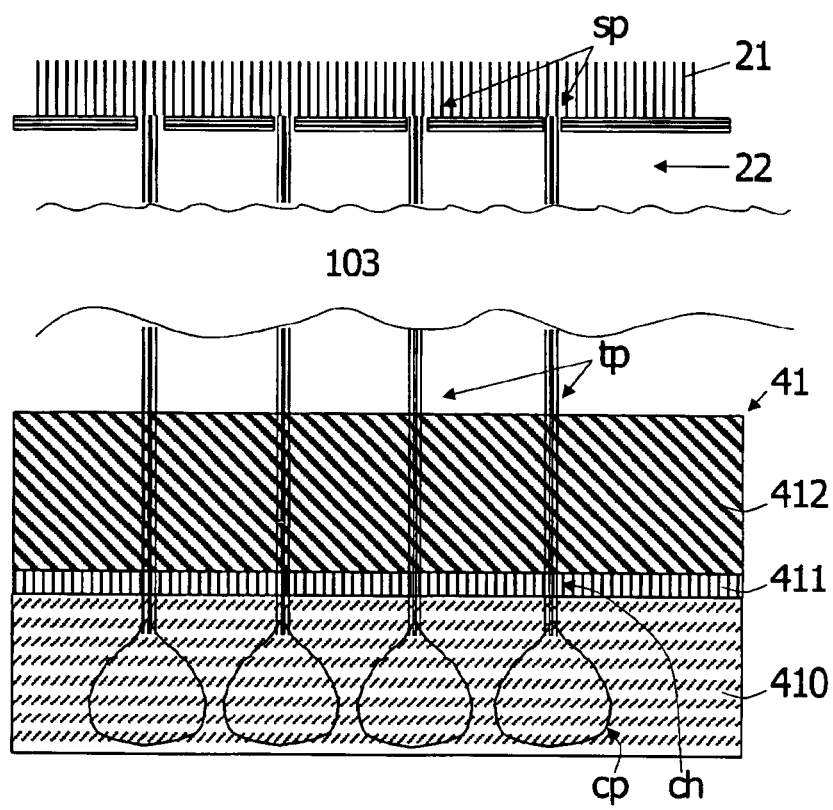
FIG. 4 the principle of high-energy ion implantography employed in the apparatus of FIG. 1.

In FIG. 4 the principle of the ion implantation as employed in the apparatus 1 of FIG. 1 is illustrated. The lateral scales of the upper and lower portion of FIG. 4 are different so as to show the structures in the beam 22 at corresponding extension; since the projection system 103 is demagnifying, the scale is reduced in FIG. 4 accordingly. As already mentioned, the stencil pattern sp in the pattern definition means 102 forms the ion beam 21 into a structured beam 22 which bears the pattern information. The beam is then projected through the projection system 103 as explained above and forms a preferably telecentric image tp of the stencil pattern sp on the target 41.

The impinging ion beam affects the material of the target in different ways according to the depth of passage into the target material. When an ion hits the surface of a target, it is first decelerated without lateral change of direction due to interactions with the target electrons. At an initial ion energy of about 20 keV, this electronic stopping causes an energy loss per length unit about 2 keV/nm. Thus, the ion path forms a well-defined channel ch. When the ion has been stopped to relatively low energies, so-called nuclear stopping sets in, which may cause significant change of direction by lateral straggling of the ions. In effect, nuclear stopping leads to a typical club-shaped plume cp when a number of ion trajectories are summed up.

Figure 5:
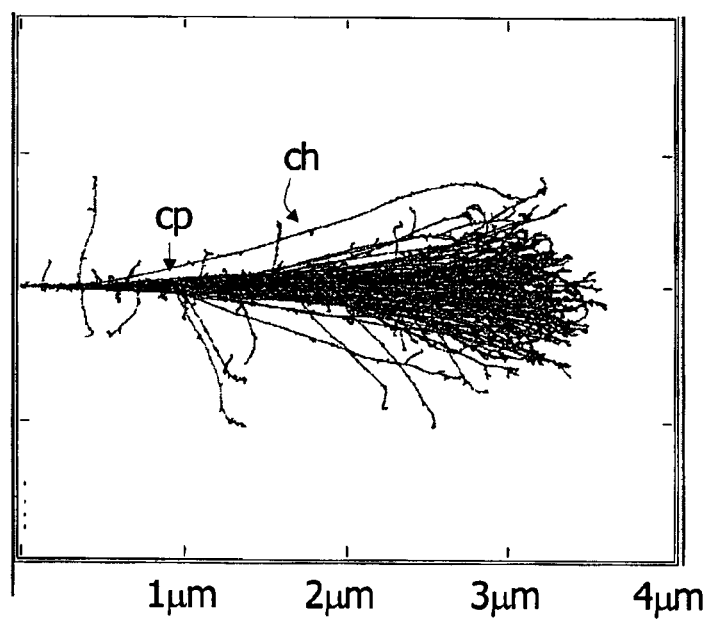
FIG. 5 an irradiation plume generated in a target by a fine high-energy ion beam.

In FIG. 5 a simulation of a plume is shown. Upon a $SiO_2$ bulk, a narrow ion beam of 5 MeV Ar ions is irradiated from the left. The simulation was done with the SRIM.EXE software of James F. Ziegler (http://www.ge.infn.it/~corvi/doc/soft-ware/srim2003/SRIM.htm), (C) 1984–2002.

Apart from a small number of "ricocheting" ions, the trajectories first run along a channel ch of small lateral dimensions and then fan out into a plume cp.

The implantography mainly operates at the range of electronic stopping, where a modification of the material can be achieved with very high resolution. This is shown in FIG. 4 as well. The irradiation channels ch permeate a cover layer 412 and a buried layer 411 to be structured. The layer 411 my be, for instance, a metastable material in which a transition is induced, for example of magnetic or structural (recrystallization or amorphization) type, or a electrical conducting layer whose conductivity is modified by the irradiation, so as to form selected regions of suppressed conductivity in order to define conducting lines etc. The ions are only stopped in the underlying target substrate 410 which does not contribute to the structure to be formed, other than as mechanical support.

Since the length of the channel ch in front of the plume cp increases with increasing ion energy, high ion energies are desirable for structuring layers at considerable depths of up to several $\mu$m. Further advantages of the implantography system discussed above are:

Contact-free structuring of the target due to the use of a separate mask or pattern definition device.

The pattern definition means (mask) is only affected by ions of low kinetic energies, typically a few keV per charge (in contrast to the ion energies at the end of the acceleration, typically several 100 keV or several MeV). This enhances the lifetime of the mask and the delicate patterns formed on it drastically.

Large image reductions are possible. This makes possible the realization of nanotechnology applications on the target, with feature sizes in the range of 10 nm or less, while the structures on the mask can be designed at a larger scale. Moreover, the scale reduction enhances the density of ions at the target surface by a factor of demagnification squared.

Due to the acceleration of the telecentric beam emerging from the reduction optics 31 in the electric field of the accelerator 32, the numerical aperture is reduced. This reduces the geometric image errors while maintaining the resolution, i.e., the image scale. This also leads to a high depth or resolution in the target.

The use of a projection system having a wide image field allows for high productivity.

Different ion species and charge states of the same ion species can be selected according to the desired parameters of energy deposit, depth of irradiation and so on.

Buried layers can be structured, due to the high depth of penetration and length of the electronic-stopping channel.

Various applications, such as structuring by irradiation, selected doping, ion beam induced mixing, ion beam induced formation of clusters, etc.

Beside structuring regions below the topmost surface, there is also the possibility to use highly charged ions for "potential structuring", i.e. structuring by depositing the potential energy of the ion to the substrate, of the outermost surface region. The apparatus according to the invention enables potential structuring, for example, of biological materials or insulators, without changing the substrate matrix underneath due to the comparably low kinetic energy deposition in the same region, which occurs at high beam energy, hence achieving a very high surface sensitivity and excellent spatial resolution. It shall be noted that potential structuring is an element-specific effect where for example $Ar^{9+}$ on metals shows no extra effect due to the high charge state, whereas $Ar^{9+}$ on the insulator $Al_2O_3$ leads to significant sputtering which can be 50× larger than for single charged $Ar^+$.

Furthermore, there are plenty of applications for ion-beam projection where very low particles energies are required, i.e., energies in the order of eV. Such applications are, for example, particle-beam induced surface chemistry applications, or "potential sputtering" as mentioned above, where the potential energy of low-energy highly charged ions is exploited for sputtering. For applications of this kind, an alternative version of the invention employs deceleration of the ions rather than acceleration. In special circumstances, de- an acceleration may be used in a combined manner.

The ion species used can be any ions with $Z \geq 3$; preferably, heavy ions with $Z \geq 18$ can be used. For applications where a chemical effect of the irradiated ions ('ion-beam induced chemistry') in the target are important, the choice of the ion species is, of course, dictated by the chemical element needed. For instance, for implantation, ions from elements B, P, As, In, or metal atoms, are of special interest.

Figure 6:
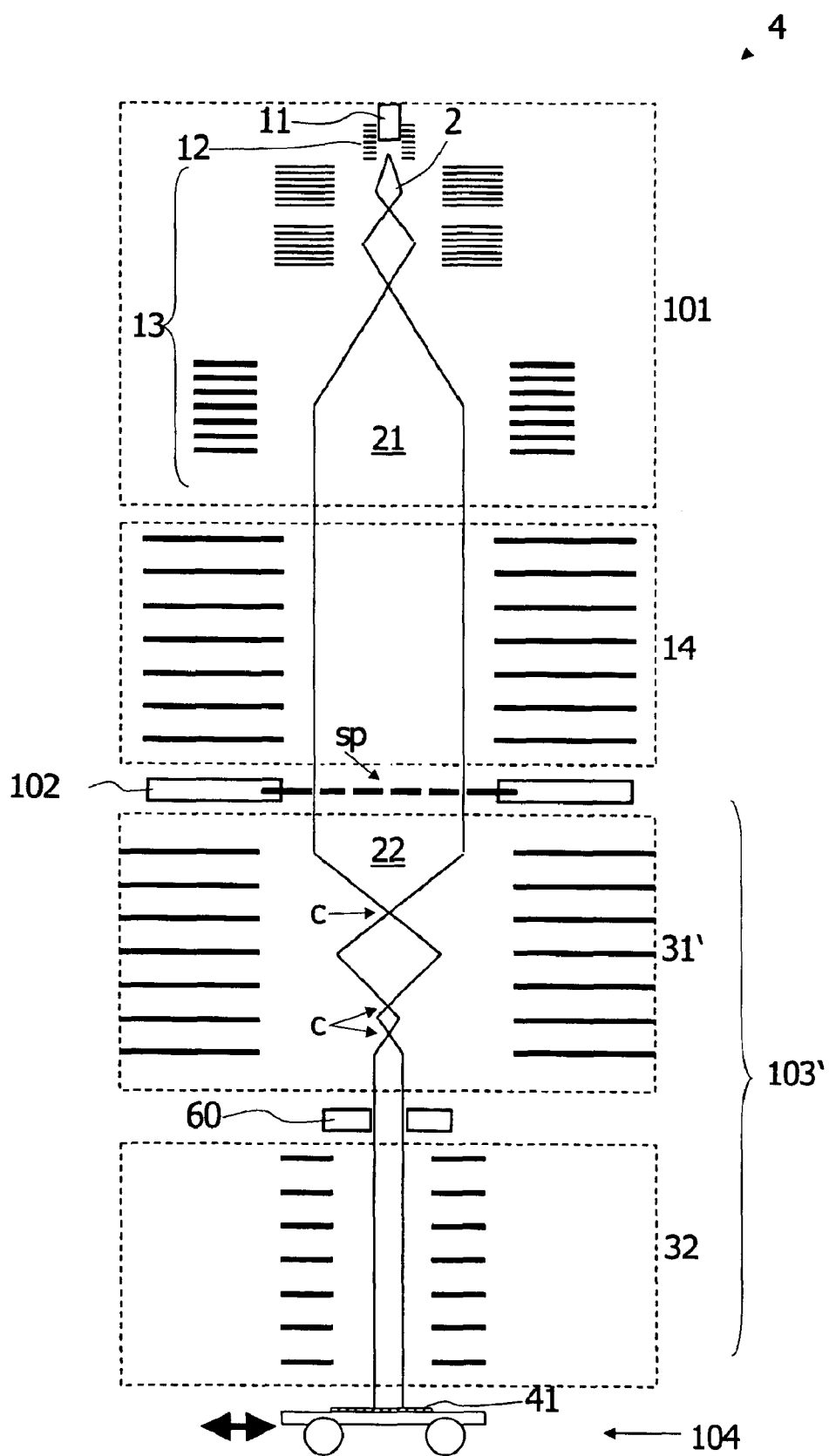
FIG. 6 a variant of the apparatus of FIG. 1.

In the case that due to the high charge states of the particles the kinetic energies attained at the mask level would be higher than desired (e.g., 220 keV at mask level for $Xe^{+44}$ with a 5 kV potential), a deceleration means can be used in the illumination system to reduce the energy of the beam at mask level. This variant embodiment is shown in FIG. 6. There, an apparatus 4 comprises an additional deceleration tube 14 which is positioned between the illumination system 101 and the pattern definition means 102. With respect to the other components, this apparatus 4 corresponds to the apparatus 1 of FIG. 1.

Since the ion energies are low at the position of the mask, the irradiation stress is lower, resulting in an increased lifetime as required for industrial implementations, and standard technologies for mask production and protection coverings for masks as known from conventional ion-beam lithography can be used. Due to the comparably low ion energies before the final acceleration, the ion-optical system can be designed for electrostatic voltages and field strengths feasible in ion beam projection.

From the provision of a deceleration means, which imparts a particularly low energy to the ions before entering the projection part of the optics, a number of advantages result from this particular optical projection system. Firstly, the low energy of the ions facilitate the use of very low electrode potentials for focusing, and consequently, allow miniaturization of the optical column 31' for projecting the low energy beam onto the substrate. Secondly, the shortening of the optical trajectory paths causes a significant reduction of the stochastic aberrations, and hence, a fundamental advantage in order to achieve a high resolution with low energy highly charged ions.

Figure 7:
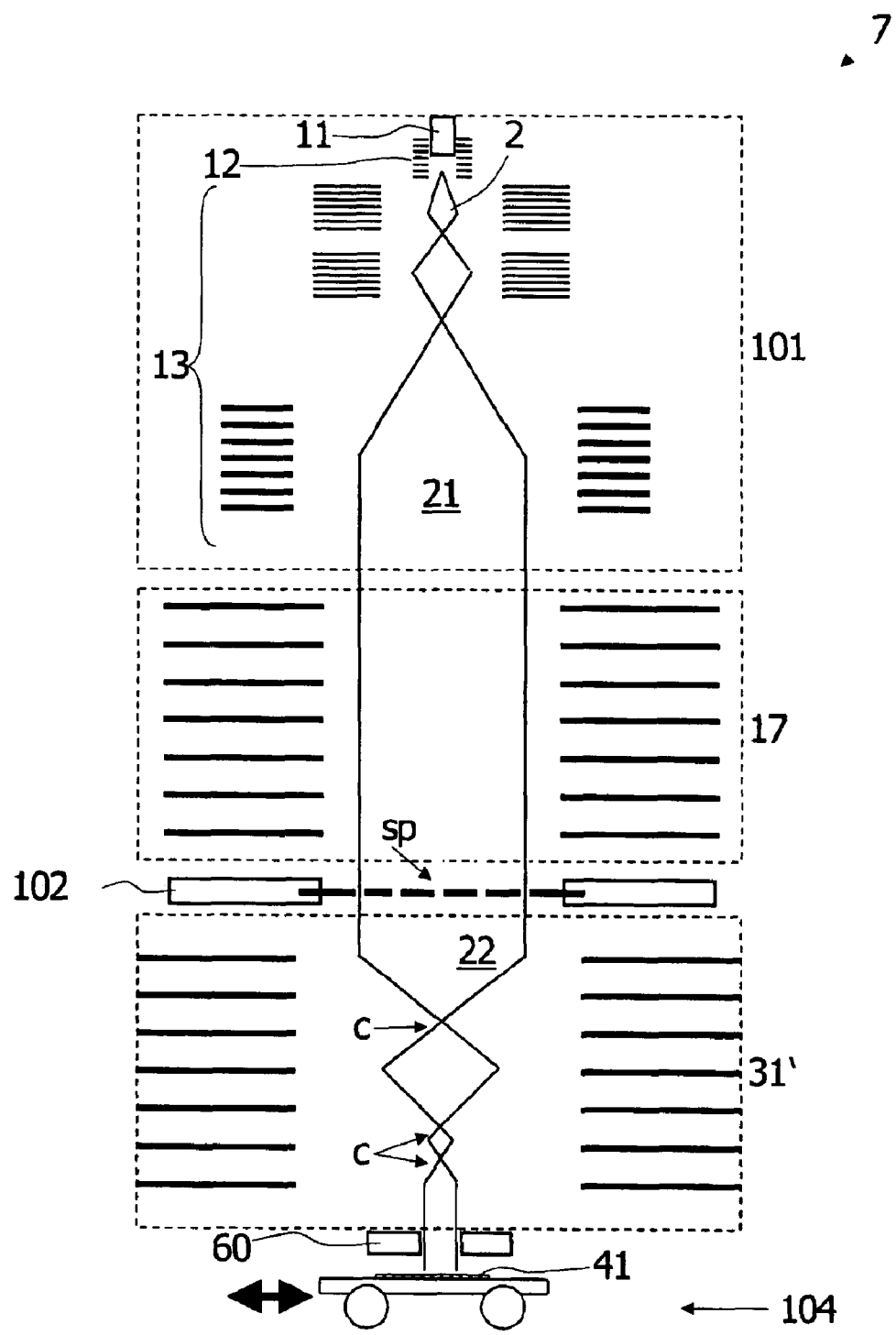
FIGS. 7 and 8 further embodiments of the invention for low-energy ion irradiation.
Figure 8:
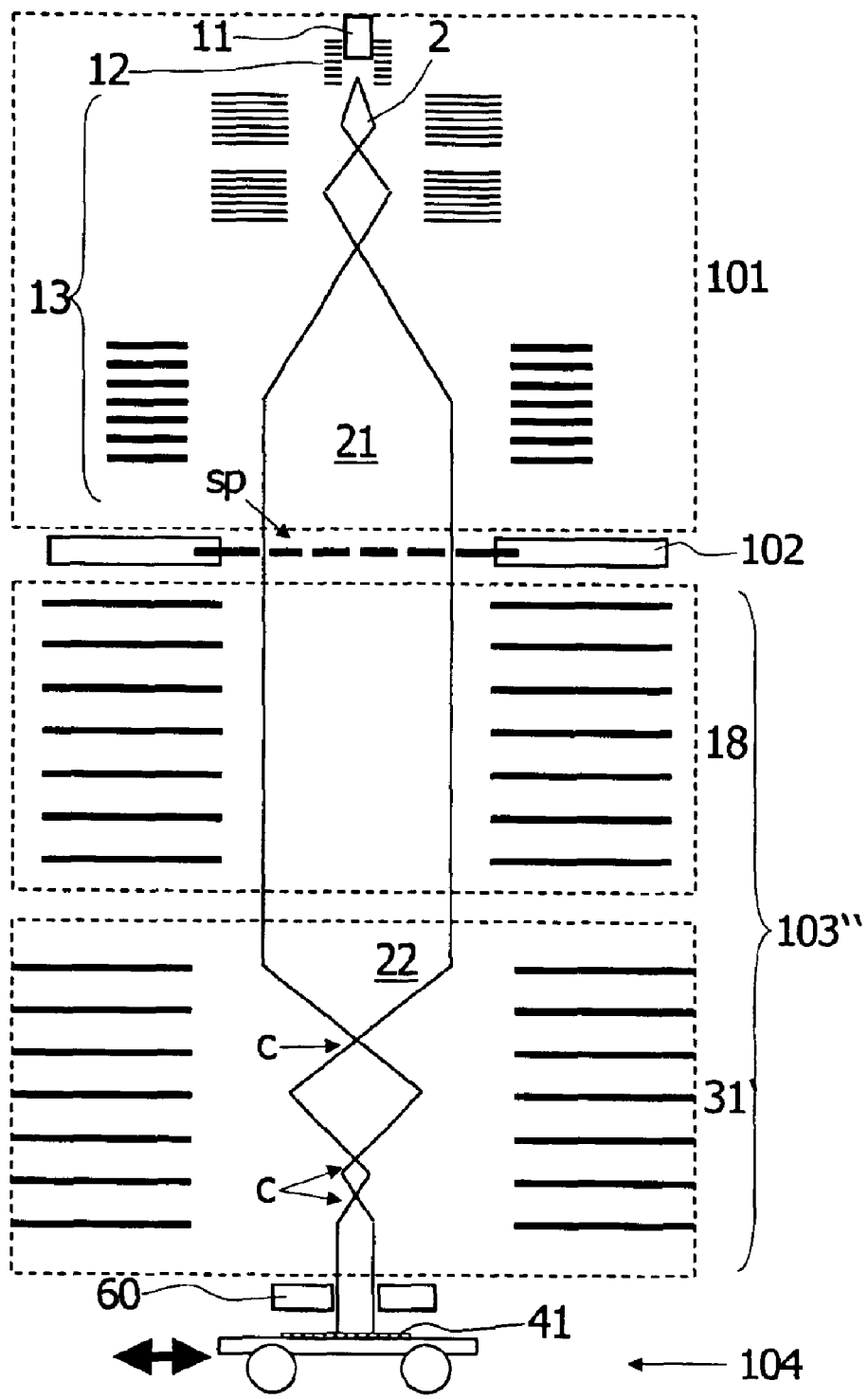

Use of a deceleration tube is also possible according to the invention without consecutive acceleration of ions. Possible applications of low kinetic energy ions were already mentioned above. FIGS. 7 and 8 show examples of apparatuses of this kind. In the apparatus 7 of FIG. 7, a deceleration tube 17 is provided in front of the pattern definition means (or stencil mask) 102. In a manner very similar to that of FIG. 6, the ion energies are reduced to low values of several 10 keV or even less, and are then projected onto the target 41. FIG. 8 shows a variant apparatus 8 in which the deceleration tube 18 is positioned right after (rather than right before) the pattern definition means, so in this case the deceleration means is a component of the projection system 103". By this measure the ion energy at the mask can be increased with respect to the ion energy at entry of the projection system. This encompasses the advantage of reducing ion-mask interactions and charging up of the mask at very low energies. In other respects, the explanations as provided in the context of FIGS. 1 to 6 apply in an analogous manner.

We claim:

1. A particle-beam exposure apparatus (1,4,7,8) for irradiating a target (41) by means of a beam (2) of energetic electrically charged particles, comprising
    an illumination system (101) for generating and forming said energetic particles into a directed beam (21),
    a pattern definition means (102) located after the illumination system as seen along the direction of the beam, said pattern definition means being adapted to position a pattern composed of apertures transparent to the energetic particles in the path of the directed beam, thus forming a patterned beam (22) emerging from the pattern definition means through the apertures, and
    a projection system (103) positioned after the pattern definition means (102) and adapted to project the patterned beam (22) onto a target (41) positioned after the projection system, the apparatus further comprising at least one acceleration/deceleration means (32,14,17, 18) containing an electric potential gradient oriented substantially parallel to the path of the beam, wherein the electric potential gradient is constant over at least a cross-section of the beam permeating the acceleration/deceleration means.

2. The apparatus of claim 1, having an acceleration/deceleration means (32,18) realized as a component of the projection system (103).

3. The apparatus of claim 2, wherein the projection system comprises a demagnifying projector (31) which is positioned in front of the acceleration/deceleration means, as seen along the direction of the beam.

4. The apparatus of claim 3, wherein the acceleration/deceleration means is an electrostatic gradient tube (32) for acceleration/deceleration of the electrically charged particles by an energy difference corresponding to more than 50 kV potential difference.

5. The apparatus of claim 3, wherein the acceleration/deceleration means is an electrostatic gradient tube (32) for acceleration/deceleration of the electrically charged particles by an energy difference corresponding to more than 100 kV potential difference.

6. The apparatus of claim 2, wherein the projection system comprises a demagnifying projector (31') which is positioned after the acceleration/deceleration means, as seen along the direction of the beam.

7. The apparatus of claim 6, wherein the acceleration/deceleration means is an electrostatic gradient tube (17,18) for deceleration to energies below n·20 eV, where n is the charge number of the electrically charged particles.

8. The apparatus of claim 1, having an acceleration/deceleration means (14,17) being positioned immediately in front of the pattern definition means (102), as seen along the direction of the beam.

9. The apparatus of claim 1, wherein the electric potential gradient is substantially constant along at least a part of the length of the acceleration/deceleration means (32).

10. The apparatus of claim 1, wherein the electrically charged particles are multiply charged.

11. The apparatus of claim 1, wherein the electrically charged particles are heavy ions, $Z \geq 2$, preferably, $Z \geq 18$.

* * * * *